United States Patent
Fitzpatrick

(10) Patent No.: US 8,386,095 B2
(45) Date of Patent: Feb. 26, 2013

(54) PERFORMING CORRECTIVE ACTION ON UNMANNED AERIAL VEHICLE USING ONE AXIS OF THREE-AXIS MAGNETOMETER

(75) Inventor: David Fitzpatrick, Rio Rancho, NM (US)

(73) Assignee: Honeywell International Inc., Morristown, NJ (US)

( * ) Notice: Subject to any disclaimer, the term of this patent is extended or adjusted under 35 U.S.C. 154(b) by 570 days.

(21) Appl. No.: 12/417,380

(22) Filed: Apr. 2, 2009

(65) Prior Publication Data

US 2010/0256839 A1    Oct. 7, 2010

(51) Int. Cl.
G05D 1/08    (2006.01)
B64C 29/00    (2006.01)

(52) U.S. Cl. ............... 701/4; 244/171; 701/525

(58) Field of Classification Search .......... 701/3, 4, 701/8, 23, 38, 41, 58, 400, 408, 525; 244/4, 244/75.1, 175, 166, 171; 324/244, 260
See application file for complete search history.

(56) References Cited

U.S. PATENT DOCUMENTS

| | | | |
|---|---|---|---|
| 3,992,707 A | | 11/1976 | Schmidtlein et al. |
| 4,525,784 A | * | 6/1985 | Hamel et al. ............ 701/1 |
| 4,664,340 A | | 5/1987 | Jackson |
| 4,807,835 A | * | 2/1989 | Fowler ............... 244/166 |
| 5,575,438 A | | 11/1996 | McGonigle et al. |
| 5,716,032 A | * | 2/1998 | McIngvale ............ 244/185 |
| 5,904,724 A | | 5/1999 | Margolin |
| 5,933,099 A | | 8/1999 | Mahon |
| 6,018,315 A | | 1/2000 | Ince et al. |
| 6,377,875 B1 | | 4/2002 | Schwaerzler |
| 6,389,335 B1 | | 5/2002 | Vos |
| 6,422,508 B1 | | 7/2002 | Barnes |
| 6,473,676 B2 | * | 10/2002 | Katz et al. ............ 701/4 |
| 6,493,631 B1 | * | 12/2002 | Burns ............... 701/472 |
| 6,502,787 B1 | | 1/2003 | Barrett |
| 6,575,402 B1 | | 6/2003 | Scott |
| 6,588,701 B2 | | 7/2003 | Yavnai |
| 6,622,090 B2 | | 9/2003 | Lin |

(Continued)

FOREIGN PATENT DOCUMENTS

DE    28 43 034 A1    8/1980
EP    1868008    12/2007

(Continued)

OTHER PUBLICATIONS

Ahn et al., "Gyroless Attitude Estimation of Sun-Pointing Satellites Using Magnetometers," IEEE Geoscience and Remote Sensing, vol. 2, No. 1, Jan. 2005, p. 8-12.*

(Continued)

*Primary Examiner* — James Trammell
*Assistant Examiner* — David Testardi
(74) *Attorney, Agent, or Firm* — Shumaker & Sieffert, P.A.

(57) ABSTRACT

Methods and systems are provided for using a measurement of only one axis of a three-axis magnetometer to perform at least one corrective action on an unmanned aerial vehicle ("UAV"). An exemplary embodiment comprises (i) receiving from a three-axis magnetometer a measurement representative of an attitude of a UAV, wherein the measurement is of only one axis of the magnetometer, (ii) comparing the measurement to an allowable range of attitudes, (iii) determining that the measurement is not within the allowable range of attitudes, and (iv) performing at least one corrective action on the UAV.

20 Claims, 4 Drawing Sheets

U.S. PATENT DOCUMENTS

| | | |
|---|---|---|
| 6,665,594 B1 | 12/2003 | Armstrong |
| 6,694,228 B2 | 2/2004 | Rios |
| 6,712,312 B1 | 3/2004 | Kucik |
| 6,813,559 B1 | 11/2004 | Bodin et al. |
| 6,847,865 B2 | 1/2005 | Carroll |
| 6,859,727 B2 | 2/2005 | Bye et al. |
| 6,873,886 B1 | 3/2005 | Mullen et al. |
| 6,925,382 B2 | 8/2005 | Lahn |
| 7,000,883 B2 | 2/2006 | Mercadal et al. |
| 7,107,148 B1 | 9/2006 | Bodin et al. |
| 7,130,741 B2 | 10/2006 | Bodin et al. |
| 7,149,611 B2 | 12/2006 | Beck et al. |
| 7,158,877 B2 | 1/2007 | Carlsson et al. |
| 7,228,227 B2 | 6/2007 | Speer |
| 7,231,294 B2 | 6/2007 | Bodin et al. |
| 7,269,513 B2 | 9/2007 | Herwitz |
| 7,286,913 B2 | 10/2007 | Bodin et al. |
| 7,289,906 B2 | 10/2007 | Van Der Merwe et al. |
| 7,299,130 B2 | 11/2007 | Mulligan et al. |
| 7,302,316 B2 | 11/2007 | Beard et al. |
| 7,343,232 B2 | 3/2008 | Duggan et al. |
| 7,520,466 B2 * | 4/2009 | Bostan ............... 244/93 |
| 7,706,932 B2 * | 4/2010 | Morales De La Rica et al. ............... 701/4 |
| 7,871,044 B2 * | 1/2011 | Hursig et al. ............... 244/183 |
| 7,970,500 B2 * | 6/2011 | Parra Carque ............... 701/7 |
| 2004/0123474 A1 * | 7/2004 | Manfred et al. ............... 33/352 |
| 2005/0138825 A1 * | 6/2005 | Manfred ............... 33/356 |
| 2005/0165517 A1 | 7/2005 | Reich |
| 2006/0097107 A1 | 5/2006 | Parks et al. |
| 2006/0102780 A1 | 5/2006 | Parks |
| 2006/0106506 A1 | 5/2006 | Nichols et al. |
| 2006/0121418 A1 | 6/2006 | DeMarco et al. |
| 2006/0192047 A1 | 8/2006 | Goossen |
| 2006/0197835 A1 | 9/2006 | Anderson et al. |
| 2006/0235584 A1 | 10/2006 | Fregene et al. |
| 2006/0253228 A1 | 11/2006 | Abraham et al. |
| 2006/0271248 A1 | 11/2006 | Cosgrove et al. |
| 2006/0287824 A1 | 12/2006 | Lin |
| 2007/0018052 A1 | 1/2007 | Eriksson |
| 2007/0069083 A1 | 3/2007 | Shams et al. |
| 2007/0093945 A1 | 4/2007 | Grzywna et al. |
| 2007/0129855 A1 | 6/2007 | Coulmeau |
| 2007/0131822 A1 | 6/2007 | Stallard |
| 2007/0200027 A1 | 8/2007 | Johnson |
| 2007/0221790 A1 | 9/2007 | Goossen |
| 2007/0244608 A1 | 10/2007 | Rath et al. |
| 2007/0246610 A1 | 10/2007 | Rath et al. |
| 2007/0271032 A1 | 11/2007 | Cheng et al. |
| 2007/0284474 A1 | 12/2007 | Olson et al. |
| 2008/0023587 A1 | 1/2008 | Head et al. |
| 2008/0033604 A1 | 2/2008 | Margolin |
| 2008/0035786 A1 | 2/2008 | Bilyk et al. |
| 2008/0059068 A1 | 3/2008 | Strelow et al. |
| 2008/0071431 A1 | 3/2008 | Dockter et al. |
| 2008/0078865 A1 | 4/2008 | Burne |
| 2008/0147254 A1 * | 6/2008 | Vos et al. ............... 701/8 |
| 2008/0269963 A1 * | 10/2008 | Vos et al. ............... 701/4 |
| 2010/0250022 A1 * | 9/2010 | Hines et al. ............... 701/2 |

FOREIGN PATENT DOCUMENTS

| | | |
|---|---|---|
| EP | 1 995 174 A2 | 11/2008 |
| GB | 2394340 | 4/2004 |
| WO | WO2005119387 | 12/2005 |
| WO | 2007001369 | 1/2007 |
| WO | 2007058643 | 5/2007 |
| WO | WO2007148246 | 12/2007 |

OTHER PUBLICATIONS

Kinkel, John F., et al., "Estimation of Vehicle Dynamic and Static Parameters from Magnetometer Data," Journal of Guidance, Control, and Dynamics, vol. 20, No. 1, Jan.-Feb. 1997, p. 111-116.*

Reply to communication from the Examining Division, for EP Application No. 10151453.7, dated Mar. 8, 2011, 14 pages.

European Examination report from corresponding EP Application No. 10151453.7, dated Apr. 8, 2011, 3 pages.

European Search Report from corresponding EP Application No. 10151453, mailed Jul. 28, 2010, 3 pages.

Spinka et al., "Control System for Unmanned Aerial Vehicles," IEEE International Conference on Industrial Informatics, 2007, pp. 455-460.

Ahn et al., "Gyroless Attitude Estimation of Sun-Pointing Satellites Using Magnetometers," IEEE Geoscience and Remote Sensing Letters, vol. 2, No. 1, Jan. 2005, 6 pgs.

European Examination Report from corresponding EP Application No. 10151453, mailed Sep. 7, 2010, 6 pgs.

* cited by examiner

PERFORMING CORRECTIVE ACTION ON UNMANNED AERIAL VEHICLE USING ONE AXIS OF THREE-AXIS MAGNETOMETER

GOVERNMENT RIGHTS

The United States Government may have certain rights in this invention pursuant to Contract No. N41756-06-C-5617, awarded by the United States Navy.

BACKGROUND

An unmanned aerial vehicle ("UAV") is a remotely piloted or self-piloted aircraft that can carry cameras, sensors, communications equipment, or other payloads. A UAV is capable of controlled, sustained, level flight and may be powered by, for example, a jet or an engine. A UAV may be remotely controlled or may fly autonomously based on preprogrammed flight plans or more complex dynamic automation systems.

UAVs have become increasingly used for various applications where the use of manned flight vehicles is not appropriate or is not feasible. For example, military applications may include surveillance, reconnaissance, target acquisition, data acquisition, communications relay, decoy, harassment, or supply flights. UAVs are also used in a growing number of civilian applications, such as firefighting when a human observer would be at risk, police observation of civil disturbances or crime scenes, reconnaissance support in natural disasters, and scientific research, such as collecting data from within a hurricane.

A UAV may have avionics equipment on board to control the flight and operation of the UAV. The avionics may control the direction, flight, stability compensation, and other aspects of flight control. The avionics may comprise, for example, a three-axis magnetometer to provide attitude measurements of the vehicle. Additionally, a UAV may carry a variety of equipment on board tailored to the mission that the UAV is to accomplish.

SUMMARY

Methods and systems are provided for using a measurement of only one axis of a three-axis magnetometer to perform at least one corrective action on an unmanned aerial vehicle ("UAV"). One embodiment comprises (i) receiving from a three-axis magnetometer a measurement representative of an attitude of a UAV, wherein the measurement is of only one axis of the magnetometer, (ii) comparing the measurement to an allowable range of attitudes, (iii) determining that the measurement is not within the allowable range of attitudes, and (iv) performing at least one corrective action on the UAV.

Another embodiment comprises (i) receiving from a three-axis magnetometer a measurement representative of an attitude of a UAV, wherein the measurement is of only one axis of the magnetometer, (ii) comparing the measurement to an allowable range of attitudes, (iii) determining that the measurement is not within the allowable range of attitudes, and (iv) shutting off an engine.

Another embodiment is a vehicle comprising (i) means for receiving from a three-axis magnetometer a measurement representative of an attitude of the vehicle, wherein the measurement is of only one axis of the magnetometer, (ii) means for comparing the measurement to an allowable range of attitudes, (iii) means for determining that the measurement is not within the allowable range of attitudes, and (iv) means for performing at least one corrective action on the vehicle.

These as well as other aspects and advantages will become apparent to those of ordinary skill in the art by reading the following detailed description, with reference where appropriate to the accompanying drawings.

BRIEF DESCRIPTION OF THE DRAWINGS

Various exemplary embodiments are described herein with reference to the following drawings, wherein like numerals denote like entities.

DETAILED DESCRIPTION OF THE DRAWINGS

1. Overview

Figure 1:
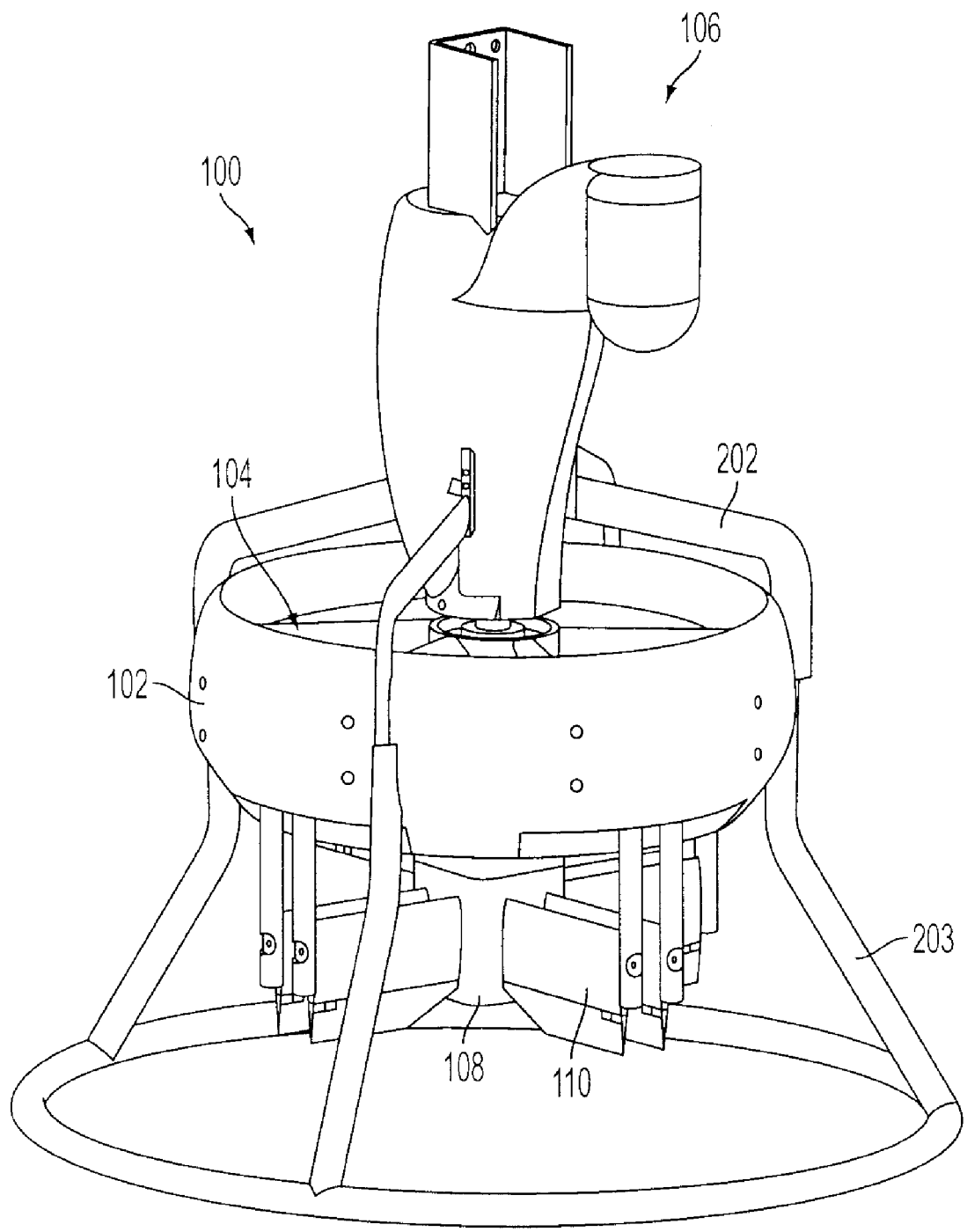
FIG. 1 is a drawing of a ducted-fan unmanned aerial vehicle ("UAV"), in accordance with exemplary embodiments.

It is possible that, during take-off, a UAV might engage in uncontrolled flight, or the UAV might tip-over. This may occur, for example, if the UAV is oriented during take-off in such a way that the thrust of the engine will not be partially cancelled out by the weight of the UAV. A VTOL (vertical take-off and landing) UAV, such as a ducted-fan UAV, may be particularly prone to tip-over or uncontrolled flight during take-off. Because of the risk of tip-over or uncontrolled flight, a UAV may determine whether it is about to engage in tip-over or uncontrolled flight and, in response, perform a corrective action. Such a corrective action may be, for example, shutting off the engine of the UAV.

A measurement that is indicative of whether the UAV is about to tip over or engage in uncontrolled flight is the attitude of the UAV. An attitude is the orientation of the UAV's axes relative to the horizon. If the attitude exceeds a certain threshold, tip-over or uncontrolled flight is possible. The attitude may be measured using, for example, a fully blended GPS/inertial navigation solution.

However, the time required to determine the attitude and perform a corrective action using a fully blended GPS/inertial navigation solution may be too great. A UAV that uses a combustion-based engine and/or a hand-start engine may require that an operator deploy the UAV, for example, outside the safety of a vehicle. An important goal is to minimize the time the operator is required to be outside the safety of the vehicle. Therefore, it is desirable to minimize the time required to determine an attitude and perform a corrective action Further, if the UAV requires an operator to deploy the UAV, it is possible that the operator may still be in proximity of the UAV during take-off. Uncontrolled flight or tip-over poses a risk of injury to the operator or any other person in proximity to the UAV, as it is possible that the UAV may strike those persons.

Among the focuses of the present invention is to receive from a three-axis magnetometer a measurement representative of an attitude of the UAV, wherein the measurement is of only one axis of the magnetometer, to compare the measurement to an allowable range of attitudes, to determine that the measurement is not within the allowable range of attitudes, and to perform at least one corrective action on the UAV.

By receiving a measurement of only one axis of the three-axis magnetometer, the amount of time required to determine the attitude of the UAV and to perform a corrective action is reduced. By using only one axis, the three-axis magnetometer may require no startup time to determine abrupt pitch and roll changes. As a result, less time is required to deploy the UAV, and therefore less time is required outside the safety of a vehicle.

Comparing the measurement to an allowable range of attitudes may comprise, for example, comparing the measurement to a range of attitudes stored on a data storage associated with the UAV. Additionally or alternatively, comparing the measurement to an allowable range of attitudes may comprise transmitting the measurement to a ground operator for comparing the measurement to a range of attitudes. Those having skill in the art will recognize that other methods of comparing the measurement to an allowable range of attitudes are possible without departing from the scope of the claims.

Performing at least one corrective action may comprise, for example, shutting off an engine of the UAV. Additionally or alternatively, performing at least one corrective action may comprise adjusting the attitude of the UAV to within the allowable range of attitudes. Those having skill in the art will recognize that the examples described are not limiting and that other methods of performing at least one corrective action are possible without departing from the scope of the claims.

It should be understood that all descriptions presented herein are exemplary in nature. Those having skill in the art will recognize that the invention may be carried out in any manner without departing from the scope of the claims. For example, there may be other methods of receiving a measurement representative of an attitude of the UAV or comparing the measurement to an allowable range of attitudes without departing from the scope of the claims.

2. Exemplary Architecture a. An Exemplary UAV

FIG. 1 is a drawing of a ducted-fan UAV, in accordance with exemplary embodiments. It should be understood that this and other arrangements described herein are set forth only as examples. Those skilled in the art will appreciate that other arrangements and elements (e.g., machines, interfaces, functions, orders, and groupings of functions, etc.) can be used instead, and that some elements may be omitted altogether. Further, many of the elements described herein are functional entities that may be implemented as discrete or distributed components or in conjunction with other components, and in any suitable combination and location. Various functions described herein as being performed by one or more entities may be carried out by hardware, firmware, and/or software. Various functions may be carried out by a processor executing instructions stored in memory.

As shown in FIG. 1, UAV 100 may include an air duct 102, a fan 104, a center body 106, a stator assembly 108, movable vanes 110, struts 202, and a landing gear 203. Fan 104 may comprise rotor blades to provide thrust so UAV 100 can lift, hover, cruise, etc. Fan 104 may be connected to an engine, perhaps in center body 106, which may spin and force air through the fan, providing lift for the UAV.

Center body 106 may be a housing that contains additional components of UAV 100, such as a camera or other surveillance equipment. Center body 106 may further include avionics equipment, such as a three-axis magnetometer. Center body 106 may also contain an engine for powering UAV 100.

UAV 100 may also include a stator assembly 108 and a plurality of fixed and/or movable vanes 110 for providing thrust vectoring for the UAV. The stator assembly 108 may be located just under the fan 104 within air duct 102 to reduce or eliminate the swirl and torque produced by the fan 104. Further downstream of the stators, the thrust vectoring vanes 110 may be located within or outside the air duct 102. For instance, the vanes 110 may be placed slightly below an exit section of the air duct 102.

UAV 100 may further include struts 202 which support the center body 106. Struts 202 may also provide a connection for the landing gear 203 of the UAV.

Figure 2:
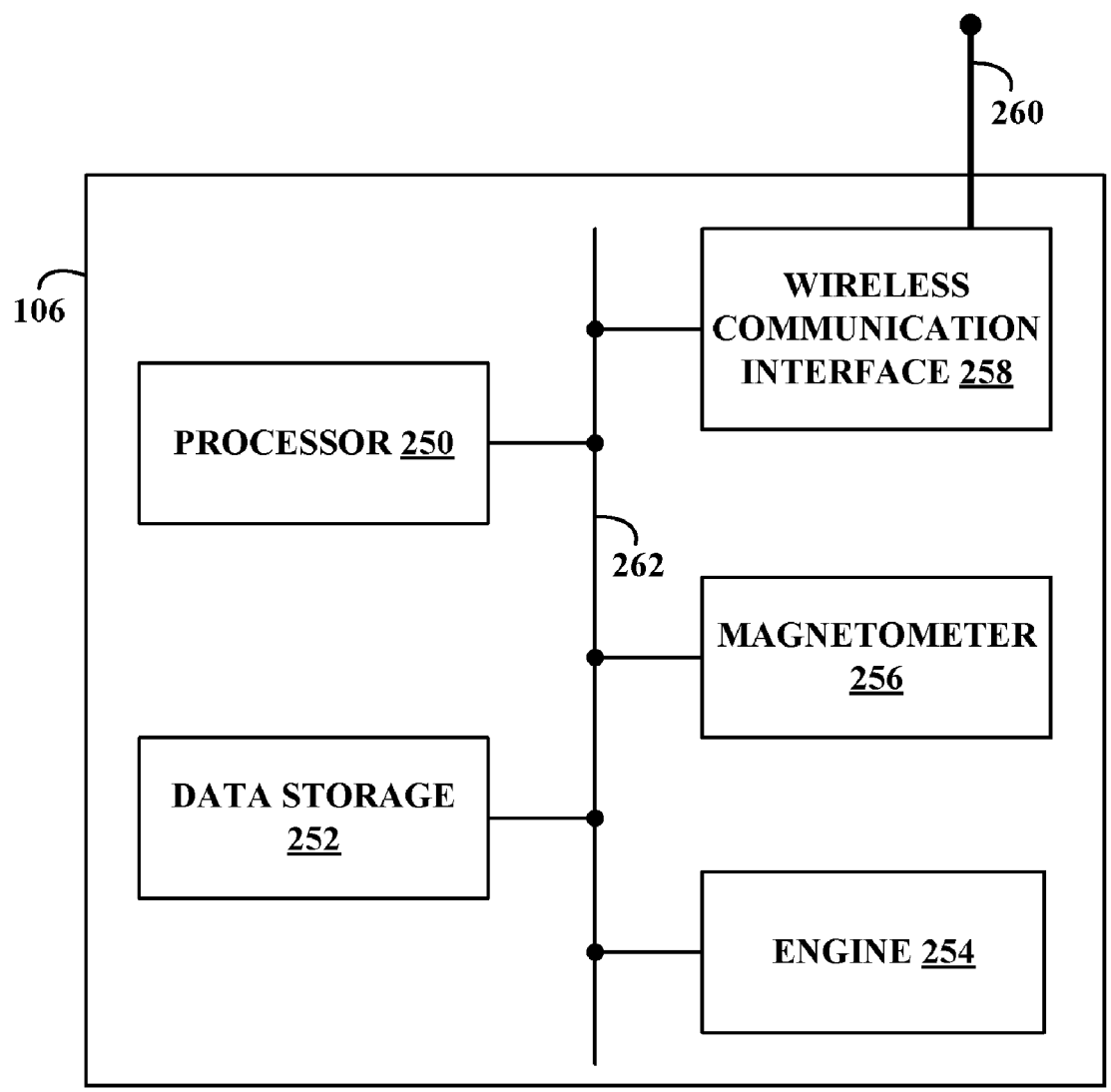
FIG. 2 is a simplified block diagram of a center body of a UAV, in accordance with exemplary embodiments.

FIG. 2 is a simplified block diagram of center body 106, in accordance with exemplary embodiments. As illustrated, center body 106 may include a processor 250, data storage 252, an engine 254, a magnetometer 256, and/or a wireless communication interface 258, all connected by a system bus 262. Further, center body 106 may include any other mechanism now known or later developed for a UAV.

In an exemplary embodiment, processor 250 may be, for example, a general purpose microprocessor and/or a discrete signal processor. Though processor 250 is described here as a single processor, those having skill in the art will recognize that center body 106 may contain multiple (e.g., parallel) processors. Data storage 252 may store a set of machine-language instructions, which are executable by processor 250 to carry out various functions described herein. Alternatively, some or all of the functions could instead be implemented through hardware.

Engine 254 may comprise any device now known or later developed for providing thrust to UAV 100. Magnetometer 256 may be a three-axis magnetometer. Wireless communication interface 258 may include a chipset suitable for communicating with one or more devices over antenna 260. Suitable devices may include, for example, a device operated by a ground controller for operating the UAV.

b. Exemplary Operation

Figure 3:
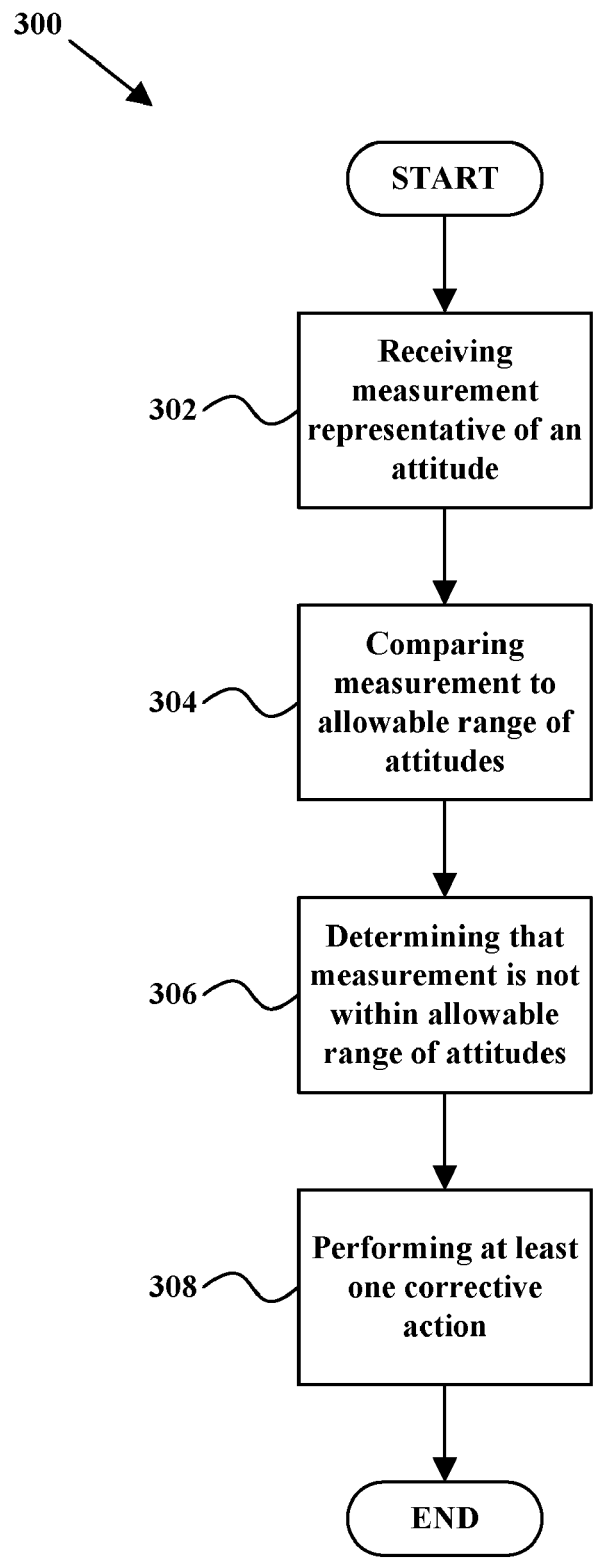
FIG. 3 is a flowchart of a method, in accordance with exemplary embodiments.

FIG. 3 is a flowchart of an exemplary embodiment, in the form of a method of operating a UAV, such as UAV 100 depicted in FIG. 1. As shown in FIG. 3, method 300 begins at step 302 by receiving from a three-axis magnetometer a measurement representative of an attitude of the UAV. The measurement is of only one axis of the three-axis magnetometer. For example, the measurement may be of only the z-axis of the three-axis magnetometer. The three-axis magnetometer may be, for example, magnetometer 256 depicted in FIG. 2. In an exemplary embodiment, the amount of time needed to receive the measurement may be small—for example, less than one second.

Method 300 continues at step 304 by comparing the measurement to an allowable range of attitudes. In an exemplary embodiment, comparing the measurement to an allowable range of attitudes may comprise comparing the measurement to a range of attitudes stored on a data storage associated with the UAV. The data storage may be, for example, data storage 252 depicted in FIG. 2. The range of attitudes may comprise, for example, a single, contiguous range, or multiple, non-contiguous ranges.

In another exemplary embodiment, comparing the measurement to an allowable range of attitudes may comprise transmitting the measurement to a ground operator for comparing the measurement to a range of attitudes. Transmitting the measurement may comprise, for example, using wireless interface 258 and antenna 260, both depicted in FIG. 2, to transmit the measurement. The ground operator, perhaps a device, might then compare the measurement to a data storage associated with the ground operator and, in response, transmit an instruction to the UAV to perform a corrective action.

Method 300 continues at step 306 by determining that the measurement is not within the allowable range of attitudes. The method then continues at step 308 by performing at least one corrective action on the UAV. In an exemplary embodiment, the amount of time required to perform at least one corrective action may be small—for example, less than one second. In another embodiment, the amount of time required to perform steps 302 through 308 may be less than one second. Note, however, that the times described to perform any of the steps in method 300 are by way of example only, and are not intended to be limiting.

In an exemplary embodiment, performing at least one corrective action comprises shutting off an engine of the UAV. The engine may be, for example, engine 254 depicted in FIG. 2. The UAV may contain, for example, an engine kill switch, and shutting off an engine may comprise triggering the engine kill switch. In another exemplary embodiment, performing at least one corrective action comprises adjusting the attitude of the UAV to within the allowable range of attitudes. Adjusting the attitude may comprise adjusting the speed of fan 104 or adjusting the angle of thrust vectoring vanes 110. Other methods of adjusting the attitude are possible without departing from the scope of the claims.

Figure 4:
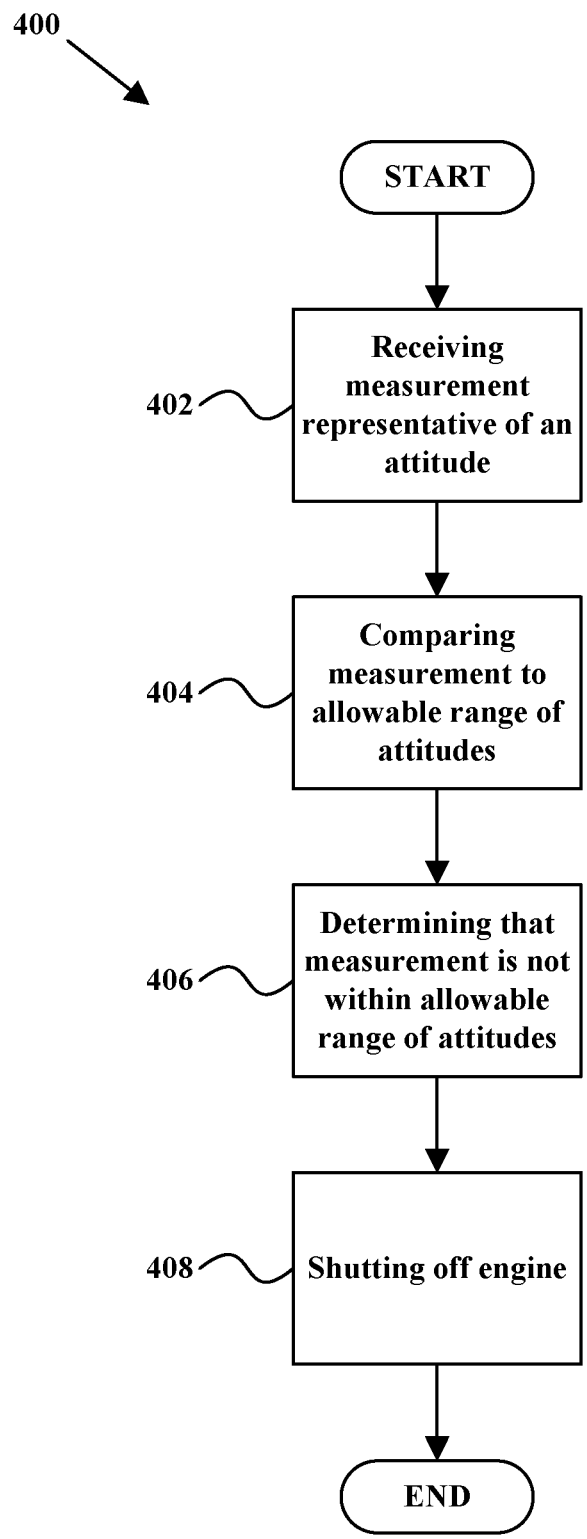
FIG. 4 is a flowchart of a method, in accordance with exemplary embodiments.

FIG. 4 is a flowchart of an exemplary embodiment, in the form of a method of operating a UAV, such as UAV 100 depicted in FIG. 1. As shown in FIG. 4, method 400 begins at step 402 by receiving from a three-axis magnetometer a measurement representative of an attitude of the UAV. The three-axis magnetometer may be, for example, magnetometer 256 depicted in FIG. 2. The measurement is of only one axis of the three-axis magnetometer. The method continues at step 404 by comparing the measurement to an allowable range of attitudes. The method then continues at step 406 by determining that the measurement is not within the allowable range of attitudes. Method 400 continues at step 408 by shutting off an engine. The engine may be, for example, engine 254 of UAV 100, as depicted in FIG. 2.

3. Conclusion

Various exemplary embodiments have been described above. Those skilled in the art will understand, however, that changes and modifications may be made to those examples without departing from the scope of the claims.

The invention claimed is:

1. A method of operating an unmanned aerial vehicle (UAV), the method comprising:
   receiving, from a three-axis magnetometer, a single measurement representative of an attitude of the UAV, wherein the single measurement is of only one axis of the three-axis magnetometer;
   comparing the single measurement to an allowable range of attitudes;
   determining that the single measurement is not within the allowable range of attitudes; and
   performing at least one corrective action on the UAV based only on the determination that the single measurement of the only one axis of the three-axis magnetometer is not within the allowable range of attitudes.

2. The method of claim 1, wherein comparing the single measurement to an allowable range of attitudes comprises comparing the single measurement to a range of attitudes stored on a data storage associated with the UAV.

3. The method of claim 1, wherein comparing the single measurement to an allowable range of attitudes comprises transmitting the single measurement to a ground operator for comparing the single measurement to a range of attitudes.

4. The method of claim 1, wherein performing at least one corrective action comprises shutting off an engine of the UAV.

5. The method of claim 4, wherein shutting off the engine of the UAV comprises triggering an engine kill switch.

6. The method of claim 1, wherein performing at least one corrective action comprises adjusting the attitude of the UAV to within the allowable range of attitudes.

7. The method of claim 6, wherein adjusting the attitude of the UAV to within the allowable range of attitudes comprises adjusting an angle of a thrust vectoring vane of the UAV.

8. The method of claim 6, wherein adjusting the attitude of the UAV to within the allowable range of attitudes comprises adjusting a speed of a fan providing thrust to the UAV.

9. An unmanned aerial vehicle (UAV) comprising:
   an engine;
   a three-axis magnetometer configured to measure an attitude of the UAV; and
   a processor connected to the magnetometer and configured to:
      receive, from the magnetometer, a single measurement representative of the attitude of the UAV, wherein the single measurement is of only one axis of the three-axis magnetometer;
      compare the single measurement to an allowable range of attitudes;
      determine that the single measurement is not within the allowable range of attitudes; and
      perform at least one corrective action on the UAV based only on the determination that the single measurement of the only one axis of the three-axis magnetometer is not within the allowable range of attitudes.

10. The UAV of claim 9, further comprising a data storage connected to the processor, wherein the allowable range of attitudes is stored on the data storage.

11. The UAV of claim 9, wherein the processor is configured to compare the single measurement to an allowable range of attitudes by at least transmitting the single measurement to a ground operator for comparing the single measurement to the range of attitudes.

12. The UAV of claim 9, wherein the processor is configured to perform the at least one corrective action by at least shutting off the engine.

13. The UAV of claim 12, further comprising an engine kill switch, wherein the processor is configured to shut off the engine by at least triggering the engine kill switch.

14. The UAV of claim 9, wherein the processor is configured to perform the at least one corrective action by at least adjusting the attitude of the UAV to within the allowable range of attitudes.

15. A vehicle comprising:
   means for receiving, from a three-axis magnetometer, a single measurement representative of an attitude of the vehicle, wherein the single measurement is of only one axis of the three-axis magnetometer;
   means for comparing the single measurement to an allowable range of attitudes;
   means for determining that the single measurement is not within the allowable range of attitudes; and
   means for performing at least one corrective action on the vehicle based only on the determination that the single measurement of the only one axis of the three-axis magnetometer is not within the allowable range of attitudes.

16. The vehicle of claim 15, wherein the means for comparing the single measurement to an allowable range of attitudes comprises means for comparing the single measurement to a range of attitudes stored on a data storage associated with the vehicle.

17. The vehicle of claim 15, wherein the means for comparing the single measurement to an allowable range of attitudes comprises means for transmitting the single measurement to a ground operator for comparing the single measurement to a range of attitudes.

18. The vehicle of claim 15, wherein the means for performing at least one corrective action comprises means for shutting off an engine of the vehicle.

19. The vehicle of claim 15, wherein the means for performing at least one corrective action comprises means for adjusting the attitude of the vehicle to within the allowable range of attitudes.

20. The vehicle of claim 19, wherein the means for adjusting the attitude of the vehicle to within the allowable range of attitudes comprises at least one of means for adjusting an angle of a thrust vectoring vane of the vehicle or means for adjusting a speed of a fan providing thrust to the vehicle.

* * * * *